(12) United States Patent
Chouraku et al.

(10) Patent No.: US 7,958,784 B2
(45) Date of Patent: Jun. 14, 2011

(54) PRESSURE DETECTOR AND ELECTRONIC APPARATUS HAVING THE SAME

(75) Inventors: Kouhei Chouraku, Kawasaki (JP); Yasushi Yui, Kawasaki (JP); Shingo Yamaguchi, Kawasaki (JP); Satoshi Kanbayashi, Kawasaki (JP); Hayato Shida, Kawasaki (JP); Yasuhiro Ite, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/457,989

(22) Filed: Jun. 26, 2009

(65) Prior Publication Data

US 2009/0272195 A1    Nov. 5, 2009

Related U.S. Application Data

(63) Continuation of application No. PCT/JP2006/326129, filed on Dec. 27, 2006.

(51) Int. Cl.
*G01L 7/00* (2006.01)

(52) U.S. Cl. ............... 73/714; 73/715; 73/753

(58) Field of Classification Search .......... None
See application file for complete search history.

(56) References Cited

U.S. PATENT DOCUMENTS

| | | | |
|---|---|---|---|
| 4,881,400 A * | 11/1989 | Goodman et al. | 73/709 |
| 6,322,921 B1 * | 11/2001 | Iwaizono et al. | 429/56 |
| 6,370,959 B1 * | 4/2002 | Schwager | 73/715 |
| 6,887,618 B2 * | 5/2005 | Shelekhin et al. | 429/175 |
| 7,073,375 B2 * | 7/2006 | Parker et al. | 73/114.76 |

FOREIGN PATENT DOCUMENTS

| | | |
|---|---|---|
| JP | 1-253616 | 10/1989 |
| JP | 2-71966 | 5/1990 |
| JP | 7-105932 | 4/1995 |
| JP | 8-65822 | 3/1996 |
| JP | 11-111263 | 4/1999 |
| JP | 11111263 A * | 4/1999 |
| JP | 11-345554 | 12/1999 |
| JP | 2001-116637 | 4/2001 |
| JP | 2002-181228 | 6/2002 |
| JP | 2006-177919 | 7/2006 |

OTHER PUBLICATIONS

International Search Report (*Form PCT/ISA/210*) for International Application No. PCT/JP2006/326129, mailed Apr. 10, 2007.
Taiwanese Office Action issued Apr. 15, 2010 in corresponding Taiwanese Patent Application 095149163.

* cited by examiner

*Primary Examiner* — Lisa M Caputo
*Assistant Examiner* — Jermaine Jenkins
(74) *Attorney, Agent, or Firm* — Staas & Halsey LLP

(57) ABSTRACT

A pressure detector configured to detect a predetermined pressure includes a housing having a concave that includes a perforation hole that perforates the housing, a sheet configured to cover the concave and to rupture when placed in an environment of the predetermined pressure or higher, and a semipermeable membrane configured to cover one end of the perforation hole, and to allow air to pass through the semipermeable membrane, the semipermeable membrane being configured to prevent water from passing through the semipermeable membrane.

11 Claims, 7 Drawing Sheets

PRESSURE DETECTOR AND ELECTRONIC APPARATUS HAVING THE SAME

This application is a continuation that claims the benefit of PCT/JP2006/326129, filed Dec. 27, 2006, which is hereby incorporated by reference herein in its entirety.

BACKGROUND OF THE INVENTION

1. Field of the Invention

The present invention relates generally to a pressure detector, and more particularly to a pressure detector configured to detect whether the pressure detector receives a predetermined pressure or higher. The present invention is suitable, for example, for a water pressure detector configured to detect whether a cellular phone is placed in a water depth deeper than 2 m.

2. Description of the Related Art

Due to the spread of a portable information apparatus, its environmental guarantee becomes important. For this purpose, a means for easily and less expensively detecting whether the apparatus is placed in the guaranteed environment is required. A pressure is one of the environments to be guaranteed. For example, some cellular phones guarantee the environment resistance down to a predetermined water depth, such as a water depth of 2 m. This is a manufacture's guarantee that the cellular phone even when soaked in water by mistake does not break in the guaranteed environmental range. If the apparatus cannot be proof against the environment in the guaranteed range, a manufacturer needs to repair the cellular phone for nothing.

Prior art include Japanese Patent Laid-Open Nos. 2006-17719, 2001-116637, and 2002-181228.

When a cellular phone is broken due to a submersion, the manufacture cannot conventionally easily determine whether the cellular phone was sunk more deeply than the guaranteed range, or the cellular phone could not be proof against the water depth in the guaranteed range. The contact between the water and the cellular phone needs to be allowed in the water depth in the guaranteed range. It is thus insufficient to simply provide a medium configured to chemically detect the water to the cellular phone. There is proposed no small and less expensive water pressure detector for the conventional waterproof portable information apparatus. Of course, this problem is true of other portable information apparatuses other than the cellular phone, such as a personal digital assistant ("PDA"), a laptop personal computer ("PC"), a watch, a calculator, a game machine, an audio visual apparatus, and a storage unit.

SUMMARY OF THE INVENTION

The present invention provides a pressure detector that is configured to easily and less expensively detect a pressure, and an information apparatus having the pressure detector.

A pressure detector according to one aspect of the present invention configured to detect a predetermined pressure includes a housing having a concave, and a sheet configured to cover the concave and to rupture when placed in an environment of the predetermined pressure or higher. This pressure detector can mechanically detect the predetermined pressure by determining whether or not the sheet ruptures. A pressure detector according to another aspect of the present invention configured to detect a predetermined pressure includes a support part that does not deform under the predetermined pressure, and a deformation member attached to the support part so that the deformation member can deform, and configured to provide a plastic deformation when placed in an environment of the predetermined pressure or higher. This pressure detector can mechanically detect the predetermined pressure by determining whether or not the deformation member provides the plastic deformation.

The pressure detector may further include a projection provided in the concave opposite to the sheet, and configured to facilitate a rupture of the sheet by contacting the sheet when the sheet deforms toward inside of the concave. The projection facilitates control over the sheet rupturing pressure. The housing preferably has a chamfered contour configured to define the concave and to contact the sheet. This configuration can prevent a rupture of the sheet by the edge of the housing in the elastic deformation range before the pressure reaches the predetermined pressure, and can improve the pressure detection precision.

The concave may include a perforation hole that perforates the housing, wherein the pressure detector further comprises a semipermeable membrane configured to cover one end of the perforation hole, and to allow air to pass through the semipermeable membrane, the semipermeable membrane being configured to prevent water from passing through the semipermeable membrane. Thereby, the pressure detector can particularly serve as a water pressure detector, and a rupture of the sheet due to a pressure other than the water pressure can be prevented.

The pressure detector may further include a protection member provided to the sheet at a side opposite to the concave, fixed onto the housing, and configured to protect the sheet from deforming to a side opposite to the concave and from rupturing. This configuration can prevent a heave and rupture of the sheet in the low-pressure atmosphere, such as the inside of the airplane, due to an increase of the internal pressure of the concave.

A color of an internal surface of the concave is preferably different from a color of the sheet. This configuration can improve the visibility when the sheet ruptures. The pressure detector preferably further includes a member provided in the concave, a physical property of the member being configured to change when reacted with water, and the member maintaining a state of a changed physical property even after the member is dried. This member can improve the visibility when the sheet ruptures and the inside of the concave is soaked. The sheet may include a two-layer structure, and the pressure detector may further include a coloring agent held in the sheet, the coloring agent having a color different from a color of the sheet. The coloring agent includes a solid and liquid of coating, ink, and dye. The held coloring agent paints the sheet when the sheet ruptures, and can improve the visibility of the rupture of the sheet.

Further features of the present invention will become apparent from the following description of exemplary embodiments with reference to the attached drawings.

DESCRIPTION OF THE EMBODIMENTS

Figure 1:
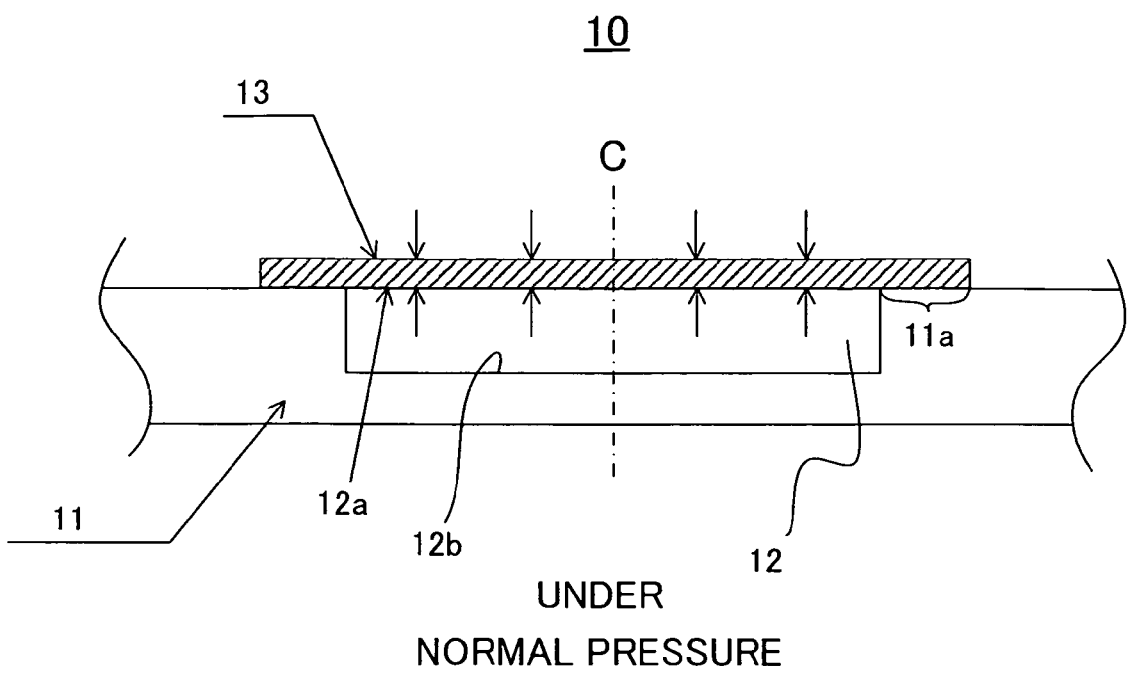
FIG. 1 is a schematic sectional view of a pressure detector according one embodiment of the present invention.

Referring now to the accompanying drawings, a description will be given of a pressure detector 10 according to the present invention. The pressure detector according to the present invention detects a predetermined pressure, but it detects a specific water pressure in this embodiment. The pressure detector 10 is mounted onto the information apparatus, and may be a unit that is separate from the information apparatus, or incorporated into and integrated with the information apparatus. The pressure detector 10 includes, as shown in FIG. 1, a housing 11 and a sheet 13. Here, FIG. 1 is a schematic sectional view of the pressure detector 10.

The housing 11 has a concave 12, and is made of resin molding. The concave 12 can be easily formed by previously providing a corresponding shape to a mold for the injection molding. Of course, the present invention does not limit a material of the housing 11. The housing 11 may be part of a housing of the information apparatus onto which the pressure detector 10 is mounted. The housing 11 does not deform under the specific water pressure, and has a support part 11*a* that supports the sheet 13 so that the sheet 13 can deform. The support part 11*a* is a predetermined region around an opening 12*a*.

The concave 12 has a circular opening 12*a* at an upper end in FIG. 1, and a circular bottom surface 12*b*. As a result, the concave 12 has a cylindrical shape. Of course, the present invention does not limit the shape of the concave 12 to the cylindrical shape. For example, the concave 12 may be a groove having a predetermined length, and the sheet 13 may have a strip shape configured to cover it. In this embodiment, if there is no sheet 13, the concave 12 exposes to the outside. However, the pressure detector 10 would be usually mounted onto the information apparatus at a part that is not visible from the outside, and thus it is optional that the concave 12 exposes to the outside if there is no sheet 13.

It is sufficient that the concave 12 allows a deformation of the sheet 13 which results in a rupture the sheet 13. For example, the depth of the concave 12 along a C direction shown in FIG. 1 is set so that the bottom surface 12*b* of the concave 12 does not contact the sheet 31 in an elastic deformation range of the sheet 13. This is because when the sheet 13 contacts the bottom surface 12*b* in the elastic deformation range of the sheet 13, the sheet 13 cannot further deform or get torn.

The sheet 13 covers the opening 12*a* of the concave 12, and is adhered to the support part 11*a* via an adhesive (not shown). The sheet 13 is fixed onto the support part 11*a*, and configured to rupture when it is placed in the environment of the specific water pressure. The sheet 13 has a disc shape, and the center of the disc of the sheet 13 and the center of the bottom surface 12*b* of the concave 12 are arranged on the same line C. Of course, the sheet 13 does not have to completely cover the opening 12*a*.

The sheet 13 ruptures in this embodiment, but it is sufficient that the sheet 13 provides a plastic deformation under the specific pressure, because the specific pressure can be detected by determining whether or not there is a plastic deformation. The present invention does not limit the shape, the material, and the thickness of the sheet 13. For example, the sheet 13 may be a non-permeable paper, a resin sheet, such as nylon/PET, or elastic polymer.

The rupture strength of the sheet 13 can be adjusted by adjusting the size of the concave 12 and the size (such as a thickness and a diameter) of the sheet, and by changing a material of the sheet 13. For example, the sheet 13 is less likely to rupture when it is thicker or its diameter is reduced, whereas the sheet is more likely to rupture when it becomes thinner or its diameter is increased.

Figure 2A:
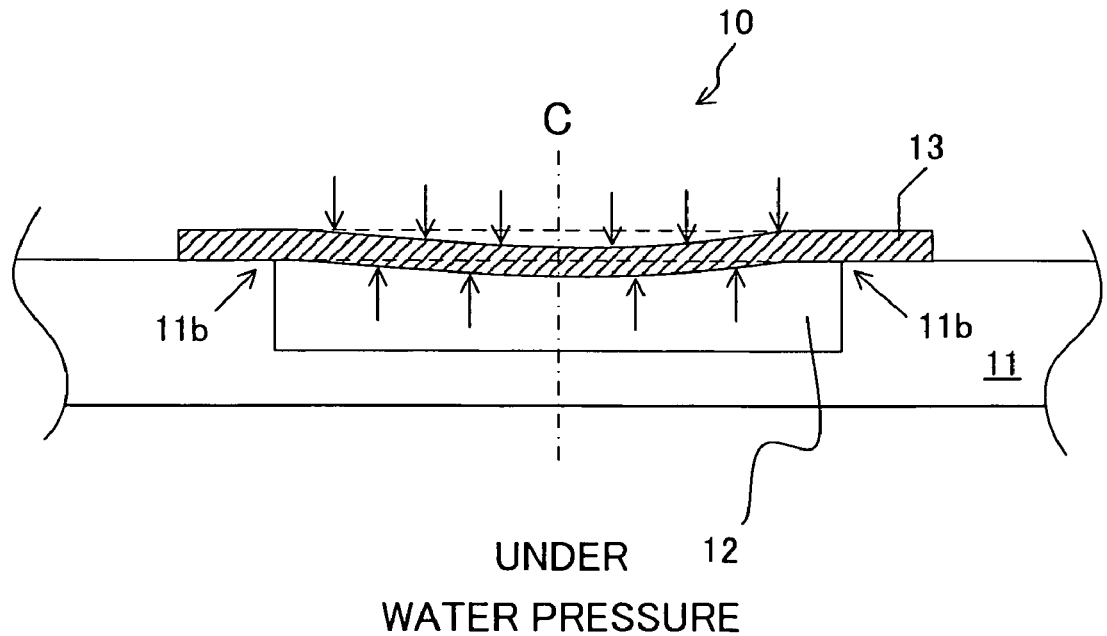
FIGS. 2A and 2B are schematic sectional views for explaining operation of the pressure detector shown in FIG. 1.
Figure 2B:
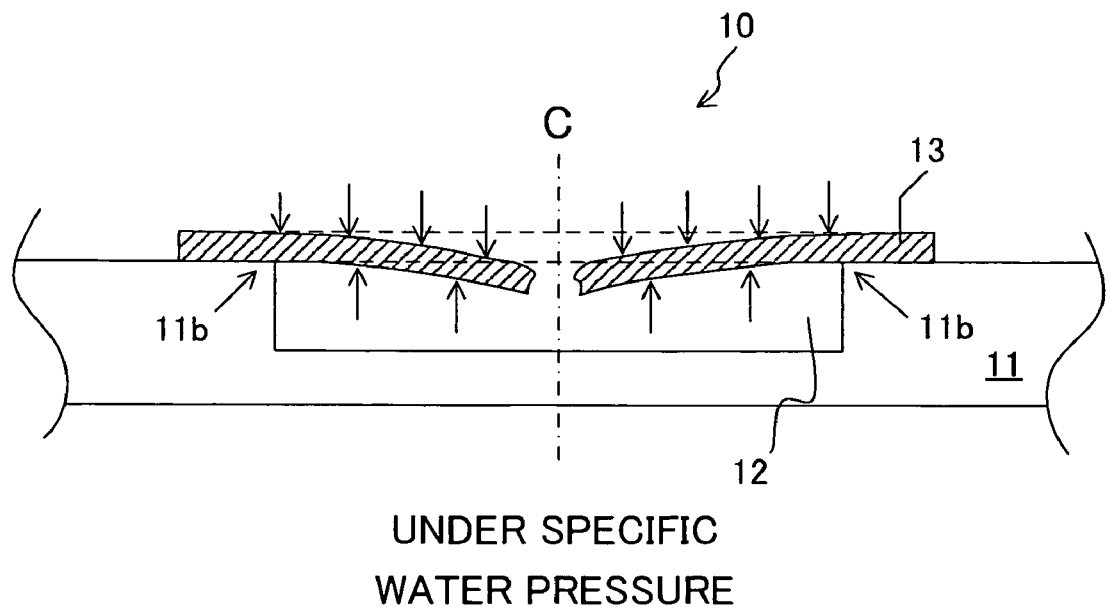

FIG. 1 shows the pressure detector 10 under the normal pressure. FIG. 2A shows the pressure detector 10 to which a pressure smaller than the specific water pressure is applied. FIG. 2B shows the pressure detector 10 to which the specific pressure or higher is applied.

Figure 3A:
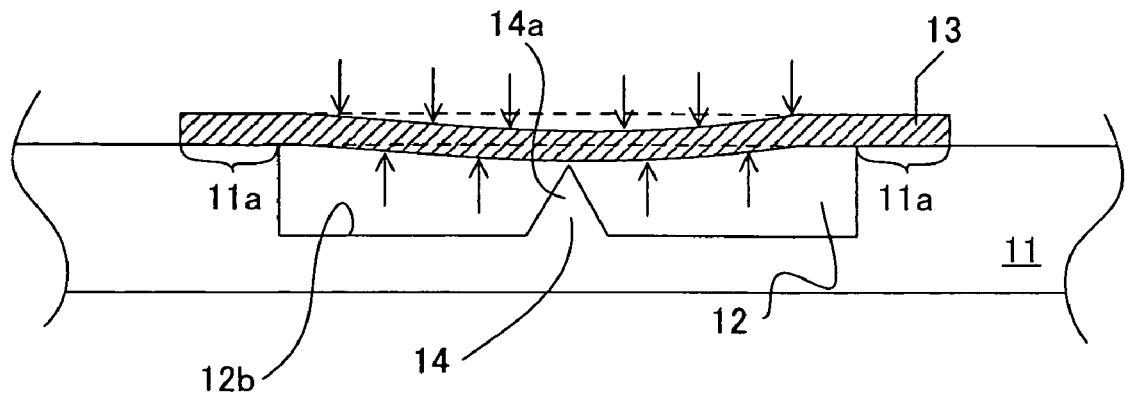
FIGS. 3A and 3B are schematic sectional views as a variation of the pressure detector shown in FIG. 1.
Figure 3B:
Figure 3B:
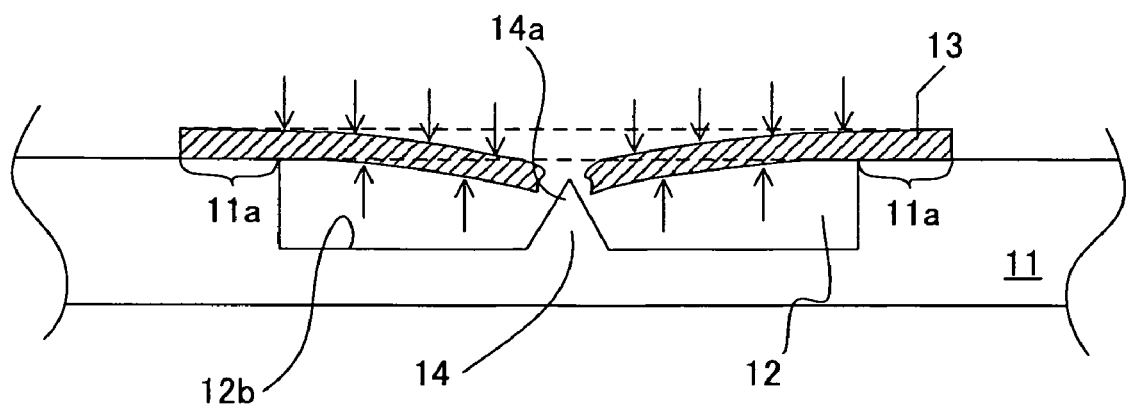

The pressure detector 10 may be replaced with a pressure detector 10A shown in FIGS. 3A and 3B. The pressure detector 10A is different from the pressure detector 10 in that the pressure detector 10A further includes a projection 14 in addition to the above housing 11 and the sheet 13. Here, FIGS. 3A and 3B are schematic sectional views for explaining the operations of the pressure detector 10A.

The projection 14 is provided opposite to the sheet 13 on the bottom surface 12*b* of the concave 12. The projection 14 is configured to contact the sheet 13 that deforms toward inside of the concave 12 through its vertex 14*a*, as shown in FIG. 3A, and facilitates a rupture of the sheet 13 as shown in FIG. 3B. The projection 14 in this embodiment has a cone shape. A line that connects a center of the bottom surface of the cone and the vertex 14*a* accords with the above line C. The projection 14 may have another shape, such as a needle shape or a pyramid, as long as the tip can apply a high pressure.

The rupture strength of the sheet 13 can be adjusted by adjusting the height of the projection 14. While this embodiment provides the projection 14 at the center of the bottom surface 12*b* of the concave 12, the present invention does not limit the position of the projection 14. The projection 14 may be part of the housing 11 or may be a separate member. When it is part of the housing 11, it may be integrally formed through injection molding. When it is a separate member from the housing, it may be attached to the housing 11 through press fitting, etc. The material of the projection 14 is not limited, but resin, metal, and another hard material is effective because it needs a strength to contact the sheet 13 and to rupture the sheet 13.

Figure 4:
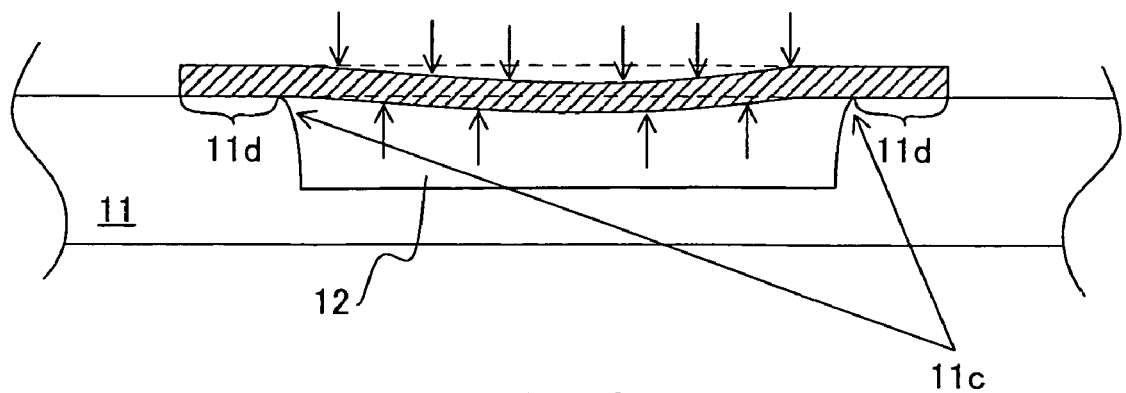
FIG. 4 is a schematic sectional view of another variation of the pressure detector shown in FIG. 1.

The pressure detector 10 may be replaced with a pressure detector 10B shown in FIG. 4. Here, FIG. 4 is a schematic sectional view of the pressure detector 10B. In the pressure detector 10, an edge 11*b* of the support part 11*a* of the housing 11 at the boundary with the concave 12 has a right angle section, as shown in FIGS. 2A and 2B. Therefore, before the sheet 13 ruptures as shown in FIG. 2B, the sheet 13 contacts the edge 11*b* in the state shown in FIG. 2A and the sheet 13 is likely to rupture due to the pressure applied by the edge 11*b*.

In the pressure detector 10B, the edge 11*b* is replaced with an edge 11*c* that has a chamfered or R shape (simply "chamfered shape" hereinafter). Here, FIG. 4 is a schematic sectional view of the pressure detector 10B. The housing 11 contacts the sheet 13 at the edge 11*c*, and defines the contour of the concave 12 at the edge 11*c*. Since the edge 11*c* is chamfered, the sheet 13 is unlikely to rupture before the specific pressure is applied after the sheet 13 elastically deforms. While the support part 11*a* is accordingly replaced with a support part 11*d*, the support part 11*d* may maintain the same area as the support part 11*a* by using a slightly wide sheet 13. In addition, of course, the structure shown in FIG. 4 may be combined with the pressure detector 10A.

Figure 5:
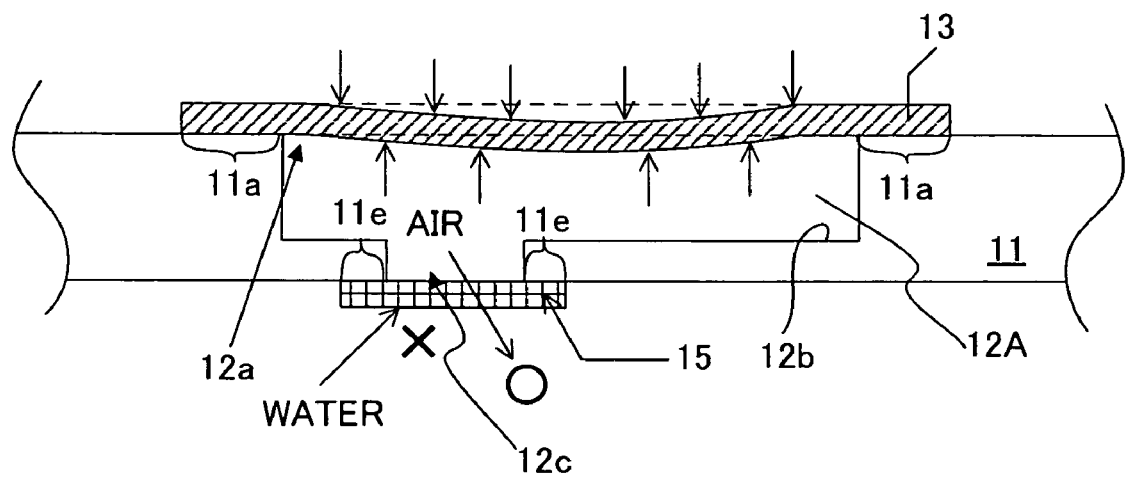
FIG. 5 is a schematic sectional view of still another variation of the pressure detector shown in FIG. 1.

The pressure detector 10 may be replaced with a pressure detector 10C shown in FIG. 5. Here, FIG. 5 is a schematic sectional view of the pressure detector 10C. The pressure detector 10C is different from the pressure detector 10 in that the pressure detector 10C further includes a perforation hole 12A, and a semipermeable membrane 15 configured to cover a bottom opening 12c of the perforation hole 12A. In FIG. 5, the perforation hole 12A has a top opening 12a and a bottom opening 12c. The perforation hole 12A has a shape that piles two cylinders having different diameters, and perforates the housing 11.

The housing 11 has a support part 11e around the opening 12c on the bottom surface of the housing 11. The semipermeable membrane 15 is adhered to the support part 11e via an adhesive agent (not shown). The semipermeable film 15 covers one end of the perforation hole 12A or the opening 12c, and is a membrane that allows air to pass through the semipermeable membrane 15 but that prevents water from passing through the semipermeable membrane 15. When the sheet 13 deforms due to the external force, air inside of the perforation hole 12A is exhausted to the outside via the opening 12c and the semipermeable membrane 15. As a result, the internal pressure rise of the perforation hole 12A due to the internal volume compression, and the sheet 13 can be deformed at the intended water pressure. Of course, the structure shown in FIG. 5 may be combined with the pressure detector 10A or 10B.

Figure 6:
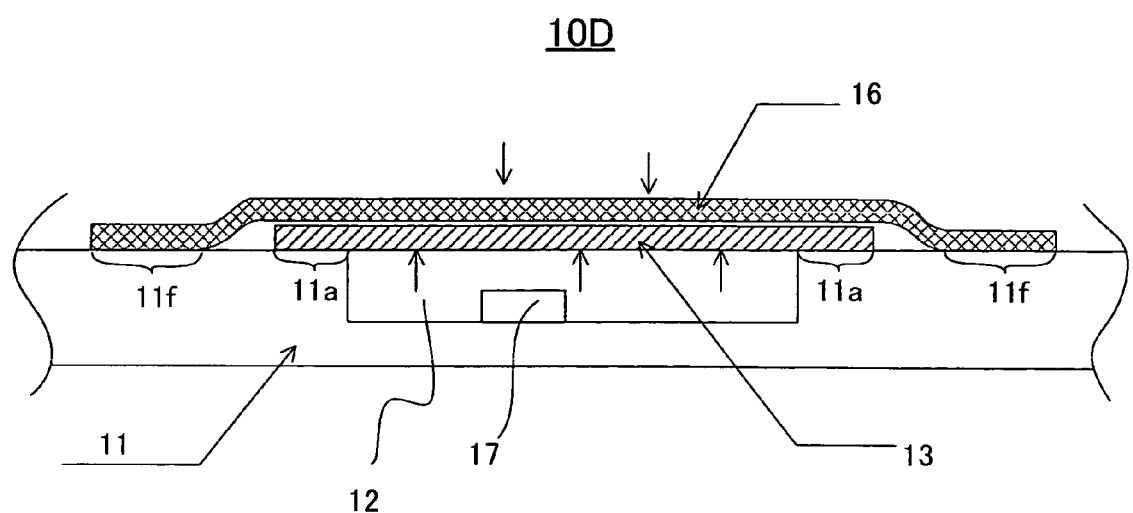
FIG. 6 is a schematic sectional view of still another variation of the pressure detector shown in FIG. 1.

The pressure detector 10 may be replaced with a pressure detector 10D shown in FIG. 6. The pressure detector 10D is different from the pressure detector 10 in that the pressure detector 10D further includes a protection member 16 and a highlight member 17. Here, FIG. 6 is a schematic sectional view of the pressure detector 10D.

The protection member 16 is provided to the sheet 13 opposite to the concave 12, and has a wider area than the sheet 13 so that the protection member 16 can cover the sheet 13. The housing 11 has a support part 11f outside of the support part 11a. The protection member 16 is adhered to the support part 11f via an adhesive agent (not shown). The protection member 16 prevents the sheet 13 from deforming upwardly in FIG. 6. As a consequence, the protection member 16 protects the sheet 13 from deforming to the opposite side to the concave 12 and from rupturing. The protection member prevents a rupture of the sheet 13 in a reduced pressure environment, such as the inside of an airplane.

The highlight member 17 is provided in the concave 12, and its physical property (such as a color, shape, and a volume) is configured to change when the highlighted member 17 is reacted with water. The highlight member 17 can maintain the state of the changed physical property even after it is dried. Thereby, whether or not the sheet 13 has ruptured can be visually determined definitely.

Of course, the protection member 16 and/or the highlight member 17 may be combined with the pressure detectors 10A to 10C.

In order to visually inspect that the sheet 13 ruptures definitely in the pressure detectors 10A to 10D, the internal surface of the concave 12, such as bottom surface 12b may have a color different from that of the sheet 13. In order to make these different colors conspicuous, these colors may be set to complementary colors, for example.

Figure 7:
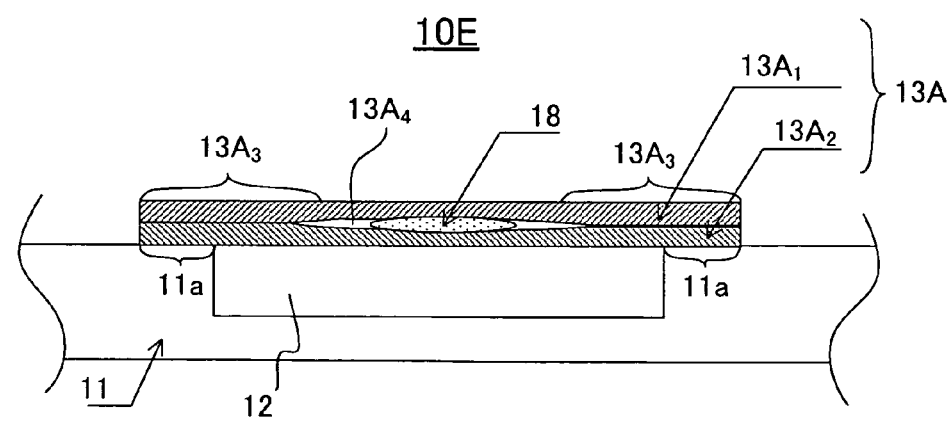
FIG. 7 is a schematic sectional view of still another variation of the pressure detector shown in FIG. 1.

The pressure detector 10 may be replaced with a pressure detector 10E shown in FIG. 7. Here, FIG. 7 is a schematic sectional view of the pressure detector 10E. The pressure detector 10E is different from the pressure detector 10 in that the pressure detector uses a sheet 13A instead of the sheet 13. The sheet 13A has two layers of sheets $13A_1$ and $13A_2$ that are adhered at ends $13A_3$. Thus, the sheet 13A is not bonded at its center, and can form a cavity $13A_4$. The cavity $13A_4$ can store a coloring agent 18 having a different color from the color of the sheet. The coloring agent 18 contains a solid or liquid coating, ink, or dye. The held coloring agent 18 paints the sheet 13 when it ruptures, and improves the visibility of the rupture of the sheet 13.

EXAMPLE 1

Figure 8A:
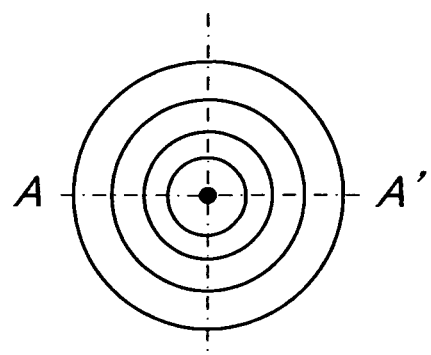
FIG. 8A is a top view of a jig.
Figure 8B:
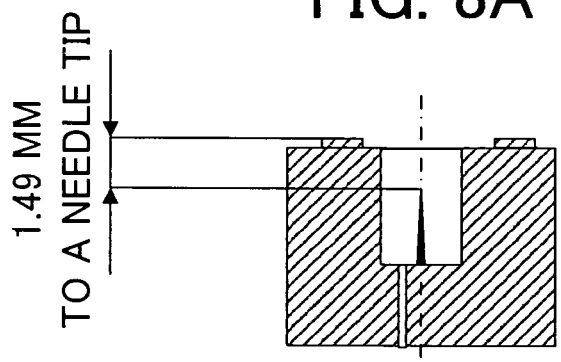
FIG. 8B is a A-A' sectional view shown in FIG. 8A.
Figure 8C:
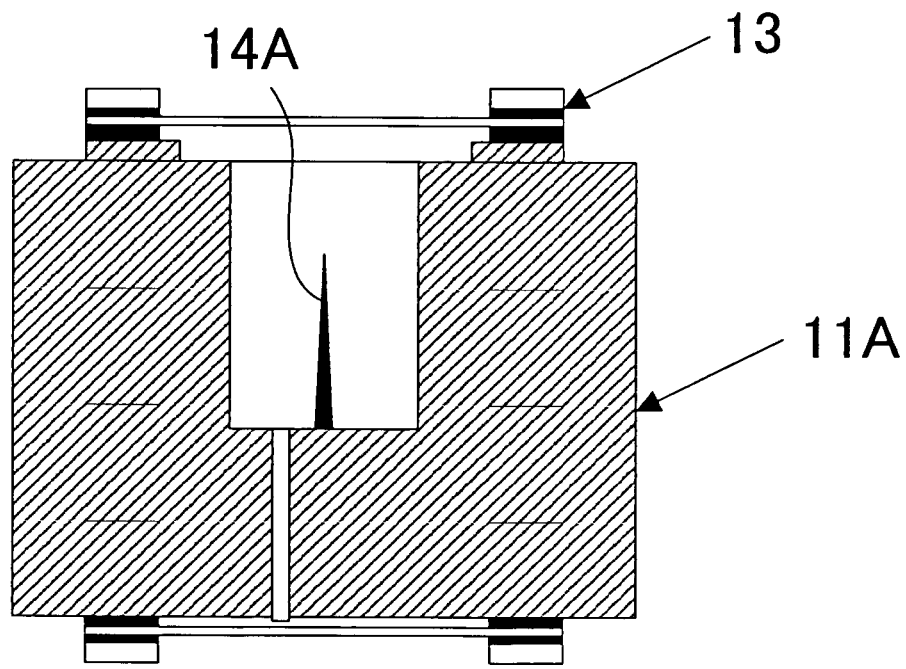
FIG. 8C is a sectional view of the jig shown in FIG. 8B mounted with a sheet and a needle.

A structure similar to the pressure detector 10A shown in FIGS. 3A and 3B was tested. In the test, the sheet 13 and a needle 14A were mounted onto a jig 11A as shown in FIGS. 8A to 8C. A series of processes were tested in which the sheet 13 was deformed due to the water pressure, the needle 14A provided onto the jig 11A stuck through the sheets 13, the sheet 13 was bored, and the liquid leaked. Here, FIG. 8A is a top view of the jig 11A. FIG. 8B is an A-A' sectional view. FIG. 8C is a sectional view of the jig 11A mounted with the sheet 13 and the needle 14A.

The immersion liquid used tap water and food red. The food red was used to promote the visibility of the liquid leakage. The pressure changed from 0 to 0.04 MPa at pitches of 0.05 MPa. The leakage was visually inspected. The sheet 13 used two types of sheets, i.e., a Gore-Tex® having a thickness of 0.02 mm and a diameter of 18 mm, and an aluminum foil having a thickness of 0.012 mm and a diameter of 18 mm.

After the sheet 13 and the needle 14A were installed onto the jig 11A, the jig 11A was submerged. After the sample was pressed under water for 30 seconds, the sample was taken out in the air and the states of the Gore-Tex® sheet and the Al foil, and the liquid leakage were confirmed. Tables 1 and 2 show the result:

TABLE 1

| Gore-Tex ® sheet | | | | |
|---|---|---|---|---|
| | | | | (Pressure Unit: MPa) |
| PRESSURE | SHEET STATE UNDER THE PRESSURE | VISUAL INSPECTION OF SHEET STATE | LIQUID LEAKAGE | NOTES |
| 0 | FLAT | NORMAL | ○ | |
| 0.005 | CONCAVE | NORMAL | ○ | |
| 0.01 | CONCAVE | NORMAL | ○ | |
| 0.015 | CONCAVE | NORMAL | ○ | |
| 0.02 | CONCAVE | SIGN OF NEEDLE | ○ | CORRESPONDING TO WATER DEPTH OF 2 M |

TABLE 1-continued

Gore-Tex ® sheet (Pressure Unit: MPa)

| PRESSURE | SHEET STATE UNDER THE PRESSURE | VISUAL INSPECTION OF SHEET STATE | LIQUID LEAKAGE | NOTES |
|---|---|---|---|---|
| 0.025 | CONCAVE | SIGN OF NEEDLE | ○ | |
| 0.03 | CONCAVE | HOLE | ○ | |
| 0.035 | CONCAVE | HOLE | X | |

TABLE 2

Aluminum Foil (Pressure Unit: MPa)

| PRESSURE | SHEET STATE UNDER THE PRESSURE | VISUAL INSPECTION OF SHEET STATE | LIQUID LEAKAGE | NOTES |
|---|---|---|---|---|
| 0 | FLAT | NORMAL | ○ | |
| 0.005 | CONCAVE | NORMAL | ○ | |
| 0.01 | CONCAVE | NORMAL | ○ | |
| 0.015 | CONCAVE | NORMAL | ○ | |
| 0.02 | CONCAVE | NORMAL | ○ | CORRESPONDING TO WATER DEPTH OF 2 M |
| 0.025 | CONCAVE | NORMAL | ○ | |
| 0.03 | CONCAVE | NORMAL | ○ | |
| 0.035 | CONCAVE | SIGN OF NEEDLE | X | |
| 0.04 | CONCAVE | HOLE | | |

From the above, it is confirmed that at 0.35 MPa corresponding to the pressure exceeding the water depth of 2 m, the sheet 13 is bored and the liquid leakage occurs at 0.04 MPa. Thereby, it is confirmed that the pressure detector 10 works.

Figure 9:
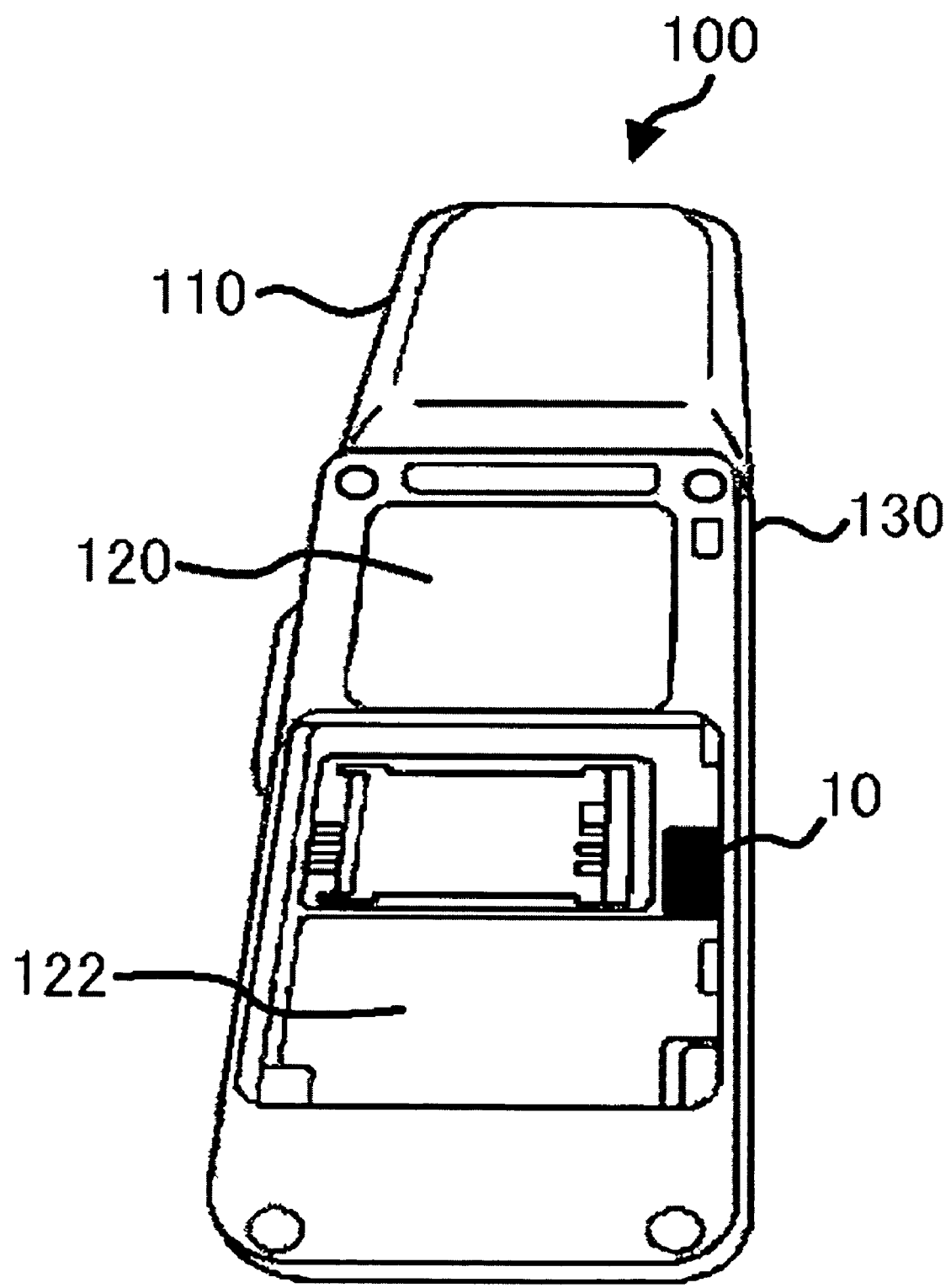
FIG. 9 is a rear view of a cellular phone having a pressure detector according to this embodiment.

Referring now to FIG. 9, a description will be given of a cellular phone 100 having one of the pressure detectors 10 to 10E. Here, FIG. 9 is a rear view of the cellular phone 100 from which a battery case is detached.

The cellular phone 100 is a foldable cellular phone in which a movable side housing 110 is coupled with a fixture side housing 120 via a hinge part 130, and the movable side housing 110 is configured to rotate relative to the fixture side housing 120. The movable side housing 110 has a housing structure in which a front case is coupled with a rear case, and houses a display, a receiver, a printed circuit substrate, etc. The fixture side housing 120 also has a housing structure in which a front case is coupled with a rear case, and houses an operating part, a printed circuit board, a speaker, a vibrator, a camera, a battery part, and an antenna. The pressure detector 10 is provided near the battery part 122 of the fixture side housing 120, and covered by the battery case (not shown).

In operation, a user does not detach the battery case (not shown) in using the cellular phone 100, the pressure detector 10 does not expose unlike FIG. 9, and the sheet 13 of the pressure detector 10 does not destroy. On the other hand, at the water depth of 2 m or deeper, water enters inside of the battery case and the pressure detector 10 can detect a predetermined water pressure.

The present invention thus can provide a pressure detector that can easily and less expensively detect the pressure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A pressure detector configured to detect a predetermined pressure, said pressure detector comprising:
    a housing having a perforation hole that perforates the housing;
    a sheet configured to cover one opening of the perforation and to rupture when placed in an environment of the predetermined pressure or higher; and
    a semipermeable membrane configured to cover another opening of the perforation hole, and to allow air to pass through the semipermeable membrane, the semipermeable membrane being configured to prevent water from passing through the semipermeable membrane.

2. The pressure detector according to claim 1, further comprising a projection provided in the perforation hole opposite to the sheet, and configured to facilitate a rupture of the sheet by contacting the sheet when the sheet deforms toward inside of the perforation hole.

3. The pressure detector according to claim 1, wherein the housing has a chamfered contour configured to define the perforation hole and to contact the sheet.

4. The pressure detector according to claim 1, further comprising a protection member provided to the sheet at a side opposite to the perforation hole, fixed onto the housing, and configured to protect the sheet from deforming to a side opposite to the perforation hole and from rupturing.

5. The pressure detector according to claim 1, wherein a color of an internal surface of the perforation hole is different from a color of the sheet.

6. The pressure detector according to claim 1, further comprising a member provided in the perforation hole, a physical property of the member being configured to change when reacted with water, and the member maintaining a state of a changed physical property even after the member is dried.

7. The pressure detector according to claim 1, wherein the sheet includes two layers, and the pressure detector further comprises a coloring agent held between the two layers in the sheet, the coloring agent having a color different from a color of the sheet.

8. An information apparatus comprising a pressure detector according to claim 1.

9. A portable electronic apparatus for detecting a predetermined pressure, comprising:
   a housing having a perforation hole that perforates the housing;
   a circuit part provided in the housing;
   a sheet configured to cover one opening of the perforation hole and to rupture when placed in an environment of the predetermined pressure or higher; and
   a semipermeable membrane configured to cover another opening of the perforation hole and to allow air to pass through the semipermeable membrane, the semipermeable membrane being configured to prevent water from passing through the semipermeable membrane.

10. The portable electronic apparatus according to claim 9, further comprising a case configured to cover the housing, and the sheet is arranged inside of the case.

11. The portable electronic apparatus according to claim 10, wherein the housing includes an accommodation part configured to house a battery, and the case covers the accommodation part.

* * * * *